US007923424B2

(12) United States Patent
Small

(10) Patent No.: US 7,923,424 B2
(45) Date of Patent: Apr. 12, 2011

(54) SEMICONDUCTOR CLEANING USING SUPERACIDS

(75) Inventor: Robert J. Small, Tucson, AZ (US)

(73) Assignee: Advanced Process Technologies, LLC, Tucson, AZ (US)

( * ) Notice: Subject to any disclaimer, the term of this patent is extended or adjusted under 35 U.S.C. 154(b) by 565 days.

(21) Appl. No.: 11/350,758

(22) Filed: Feb. 10, 2006

(65) Prior Publication Data

US 2006/0183248 A1    Aug. 17, 2006

Related U.S. Application Data

(60) Provisional application No. 60/651,998, filed on Feb. 14, 2005, provisional application No. 60/754,605, filed on Dec. 30, 2005.

(51) Int. Cl.
*C11D 7/08* (2006.01)
*B08B 3/08* (2006.01)

(52) U.S. Cl. ........ 510/175; 510/176; 510/177; 510/178; 134/1.3; 134/42; 134/902; 438/906

(58) Field of Classification Search .................. 134/1.3, 134/42, 902; 510/175, 176, 177, 178; 438/906
See application file for complete search history.

(56) References Cited

U.S. PATENT DOCUMENTS

| | | | | | |
|---|---|---|---|---|---|
| 5,221,423 | A | * | 6/1993 | Sugino et al. ................. | 438/704 |
| 5,302,240 | A | * | 4/1994 | Hori et al. ..................... | 438/719 |
| 5,965,465 | A | * | 10/1999 | Rath et al. ..................... | 438/745 |
| 6,092,539 | A | * | 7/2000 | Chang et al. ................. | 134/57 R |
| 6,147,002 | A | * | 11/2000 | Kneer ........................... | 438/692 |
| 6,200,891 | B1 | * | 3/2001 | Jagannathan et al. ........ | 438/622 |
| 6,379,634 | B1 | | 4/2002 | Fields et al. ....................... | 423/4 |
| 6,624,127 | B1 | | 9/2003 | Brask et al. .................... | 510/175 |
| 6,817,385 | B1 | | 11/2004 | Sloan et al. ........................ | 141/3 |
| 2001/0056052 | A1 | | 12/2001 | Aoki et al. ..................... | 510/175 |
| 2002/0155724 | A1 | * | 10/2002 | Sakai et al. .................... | 438/710 |
| 2003/0003762 | A1 | * | 1/2003 | Cotte et al. .................... | 438/745 |
| 2004/0211675 | A1 | * | 10/2004 | Dong et al. .................... | 205/640 |
| 2004/0217006 | A1 | | 11/2004 | Small ............................. | 205/98 |
| 2005/0106890 | A1 | * | 5/2005 | Schroeder et al. ............ | 438/719 |
| 2005/0176602 | A1 | * | 8/2005 | Hsu ................................ | 510/175 |
| 2006/0040499 | A1 | * | 2/2006 | Walther et al. ................ | 438/689 |
| 2006/0154839 | A1 | * | 7/2006 | Ilardi et al. .................... | 510/175 |
| 2006/0183654 | A1 | | 8/2006 | Small ............................. | 510/165 |
| 2007/0060490 | A1 | * | 3/2007 | Skee .............................. | 510/175 |

FOREIGN PATENT DOCUMENTS

| | | | |
|---|---|---|---|
| GB | 2373367 | * | 9/2002 |
| JP | 2004-285354 | | 10/2004 |
| KR | 2001-0058668 | | 7/2001 |
| WO | WO 02/086045 A1 | | 10/2002 |

OTHER PUBLICATIONS

CAS AN 1969:81561 (1969).*
Lu et al., "Studies of the chemically amplified development-free vapor photolithography", Journal of Photochemistry and Photobiology A: Chemistry, 1997, 110, 313-316.*
P. Mumbauer et al., "Mist Deposition in Semiconductor Device Manufacturing," *Semiconductor International*, Nov. 1, 2004, www.semiconductoronline.com.
Steven Verhaverbeke, "An Investigation of the Critical Parameters of a Atomized, Accelerated Liquid Spray to Remove Particles," presented at the 208th Meeting of the Electrochemical Society, Los Angeles, California, Oct. 16-21, 2005, symposium on Cleaning Technology in Semiconductor Device Manufacturing IX, Electronics and Photonics/Dielectric Science and Technology.
Ken-Ichi Sano et al., "Single Wafer Wet Cleaning for a High Particle Removal Efficiency on Hydrophobic Surface," presented at the 208th Meeting of the Electrochemical Society, Los Angeles, California, Oct. 16-21, 2005, symposium on Cleaning Technology in Semiconductor Device Manufacturing IX, Electronics and Photonics/Dielectric Science and Technology.
Michael Freemantle, "Mixed Solids Form Low Freezing Liquids," *Chem. Eng. News*, Sep. 12, 2005, 36-38.
Andrew P. Abbott et al., "Novel solvent properties of choline chloride/urea mixtures," *Chem. Comm.*, Jan. 7, 2003, 70-71.
Andrew P. Abbott et al., "Deep Eutectic Solvents Formed between Choline Chloride and Carboxylic Acids: Versatile Alternatives to Ionic Liquids," *J. Am. Chem. Soc.* 2004, vol. 126, 9142-9147.
A. J. Mestel, "The Electrohydrodynamic Cone-Jet at High Reynolds Number," *Journal of Aerosol Science*, 1994, vol. 25, No. 6, 1037-1047.
I. Hayati et al., "Mechanism of stable jet formation in electrohydrodynamic atomization," *Nature*, Jan. 2, 1986, vol. 319, 41-43.
H. Kikuchi, "New Aspects of Atmospheric Electro-Sciences Based on EHD (Electrohydrodynamics) and Their Application to Destruction of Tornadic Thunderstorms," *Geophysical Research Abstracts*, vol. 6, 06713, 2004.
Utkan Demirci et al., "Micromachined Microdroplet Ejector Arrays," Stanford University, E.L. Ginzton Laboratory, Stanford, CA, undated.
"An Interview with Tom Welton," ESI Special Topics, May 2004.
Successful "Green" Solvent Found for Problematic Chemicals, University of Notre Dame, May 7, 1999.
Ionic Liquids. Profile of Queen's University Belfast, School of Chemistry. ESI Special Topics, May 2004.
Michael Klein, Getting the Jump on Superacids, University of Pennsylvania, dated Oct. 25, 2000, http://www.psc.edu/science/2000/klein/getting_jump_on_superacids.pdf.
Supersonic Gas-Liquid Cleaning System, NASA Technology Transfer, RTI Technology Applications, undated, 2 pages. Overview, SCI-Bytes, undated, 2 pages.
Ionic Liquids. Organic/Inorganic Synthesis, Sigma-Aldrich, undated.
New Ionic Liquids, Sigma-Aldrich, undated.
Invitation pursuant to Rule 62a(1) EPC, European patent application No. 06 734 759.1, dated May 27, 2010.
Supplementary European Search Report, European patent application No. 06 734 759.1, dated Aug. 20, 2010.

* cited by examiner

*Primary Examiner* — Douglas Mc Ginty
(74) *Attorney, Agent, or Firm* — Steptoe & Johnson LLP

(57) ABSTRACT

A method of cleaning a substrate includes contacting a surface of a semiconductor substrate with a composition comprising a superacid. The semiconductor substrate may be a wafer.

19 Claims, No Drawings

SEMICONDUCTOR CLEANING USING SUPERACIDS

CROSS-REFERENCE TO RELATED APPLICATIONS

The benefits of Provisional Application No. 60/651,998 filed Feb. 14, 2005 and Provisional Application No. 60/754,605 filed Dec. 30, 2005 are claimed under 35 U.S.C. §119(e), and the entire contents of these applications are expressly incorporated herein by reference thereto. This application also is related to U.S. application Ser. No. 11/350,757 filed on Feb. 10, 2006, naming Robert J. Small as inventor, and entitled "Semiconductor Cleaning Using Ionic Liquids," and the entire contents of this application are expressly incorporated herein by reference thereto.

FIELD OF THE INVENTION

The invention relates to the cleaning of surfaces of substrates. In particular, the invention relates to the cleaning of the surfaces of semiconductor substrates.

BACKGROUND OF THE INVENTION

As semiconductor device sizes move toward the submicron regime, the challenges associated with particulate microcontamination present substantial hurdles to success. Advances in semiconductor processing are needed to ensure that manufacturing efficiencies can be kept high. In particular, improved performance-at-yield and significant increases in wafer throughput (e.g., more than 160 of 200 mm wafers/hr) are desired to reduce unit costs. The emerging applications for nanotechnologies also require special cleaning, and new deposition methods and materials will be required. In an industry driven by device yield, reliability, and performance criteria, substrate cleaning has become particularly important for efficiency and profitability.

Processing of advanced semiconductor materials, e.g., plasma etching, deposition, or chemical mechanical polishing, can leave residues (particle, ionic, or both) that are difficult to remove with conventional cleaning processes (such as wet benches, spray tools, etc). Critical residue particle sizes continue to decrease to below 20 nm, yet conventional particle removal methods (spray, ultrasonic, and megasonics) are ineffective, will damage the desired submicron structural features, or both.

As submicron processing advances, it becomes important to remove or neutralize etching residue and photoresist from the substrate, for example so that the residues do not absorb moisture and form acidic species that can cause undesired metal corrosion. If such metal residues are not removed, the substrate's devices may short. In addition, plasma etching of metals, for example, results in a variety of residues, and presents the challenge of adequately cleaning surface(s) of a substrate without corroding the metal.

Moreover, there is a thrust within the semiconductor industry to significantly reduce chemical and water consumption for both cost control and environmental concerns. Water consumption has been a growing concern in both the US and European markets. Although the industry is adapting cleaning chemistries with higher water content, the overall requirements are for semiconductor facilities to reduce total water consumption. Some alternative technologies contemplated for use are based on supercritical $CO_2$ with co-solvents, cryogenics, plasma, laser shock, ion beam, or UV/ozone processes.

Despite the work done, for example, with supercritical $CO_2$, laser shock waves, and UV ozone, each of these technologies has experienced significant technical barriers. Supercritical $CO_2$ currently requires the use of co-solvents and controlled rinse sequences at pressures up to 3,000 psi. Yet, the goals of elimination of secondary deposition of particles and reduction of cycle times below 5 minutes have not been achieved. For example, laser shock (the convergence of two laser beams at some distance from the wafer surface) can easily damage wafer surfaces and carries the additional requirement that the wafer be processed through a traditional wet cleaning step in order to be able to remove ionic contamination. The UV ozone process is designed to generate high-energy free radical species to scavenge organic residues, but remains largely unproven for mainstream application.

During the late 1980's, combined government/industry programs were started to develop semiconductor fabrication processes that required few or no liquid chemical processing steps. The programs were not able to achieve these goals though they were able to further establish the benefits of plasma etch over wet etch of integrated circuit (IC) features. Newer technologies have been contemplated to minimize the cleaning challenges and include direct-imageable materials and in-situ/in-step post processing. The semiconductor industry continues to support research in this direction (see, e.g., Solid State Technology, March 1999, S13; Semiconductor Online, Mar. 2, 1999). However, incomplete removal of ionic species and particle contamination continue to be pressing issues. Various matured technologies for the production of a clean and dry 90 nm node copper semiconductor wafer with ultra low-k dielectrics, for example, have failed to meet expectations (according to the ITRS 2002).

Attempts have been made with current plasma etch equipment to program, design or adjust process parameters to minimize or eliminate post-etch residues, but because of the newer materials (cobalt silicides, Cu, low-k materials, $HfO_2$, $ZrO_2$, Pt, Ru, etc.) and the increasing aspect ratios and reduced particle sizes, these efforts have not met the current cleaning requirements. Conventional wet chemical cleaning methods also have not been able to meet some of these requirements.

Mist deposition of films on substrates also is known. See P. Mumbauer et al., Mist Deposition in Semiconductor Device Manufacturing, *Semiconductor International*, dated Nov. 1, 2004.

High throughput semiconductor cleaning processes are needed for providing high particle removal efficiency (PRE) while minimizing damage or undesired etching. See Steven Verhaverbeke (Applied Materials), "An Investigation of the Critical Parameters of a Atomized, Accelerated Liquid Spray to Remove Particles," presented at the 208th Meeting of the Electrochemical Society, Los Angeles, Calif., Oct. 16-21, 2005, symposium on Cleaning Technology in Semiconductor Device Manufacturing IX, Electronics and Photonics/Dielectric Science and Technology; see also Ken-Ichi Sano et al. (Dainippon Screen and IMEC), "Single Wafer Wet Cleaning for a High Particle Removal Efficiency on Hydrophobic Surface," also presented at the 208th Meeting of the Electrochemical Society. Verhaverbeke reported the use of atomized, accelerated liquid sprays to remove particles in which the gas velocities used to accelerate the liquid droplets approached 50 m/s. Sano et al. reported the use of a two-step single wafer cleaning process.

Conventional spray cleaning processes typically employ nozzles disposed between about 45° and about 90° with respect to the wafer surface. Conventional cryogenic cleaning processes typically employ nozzles disposed between about 75° and about 90° with respect to the wafer surface. High speed wet cleaning has been limited below 100 m/s, thus well below supersonic speeds (about 360 m/s).

In view of these developments, there is a need for chemistry that can be used in the reaction/removal of contaminants on a substrate. There further is a need for chemistry that may encapsulate particles. Moreover, there is a need for chemistry that permits acceptable drying of a substrate after application. Also, there is a need for chemistry that may remove substantially all trace residuals to below 4 nm detection levels at less than 50 ppb without damage or impounding of contaminants into the substrate. In addition, there is a need for methods and apparatus for delivering the chemistry in a precisely controlled fashion. And, there is a need for processing with reduced water and chemical consumption as compared to the mainstream technologies of the prior art. There additionally is a need for such processing at atmospheric or near-atmospheric conditions instead of the high vacuum conditions required by prior art processes.

SUMMARY OF THE INVENTION

The wet chemistries of the present invention, for example, may be used in stripping photoresists and cleaning organic and inorganic compounds, including post etch and post ash residues, from a semiconductor substrate.

In one aspect, the present invention relates to a method of cleaning a substrate that includes contacting a surface of a semiconductor substrate with a composition comprising an ionic liquid. The ionic liquid can include a cation selected from the group consisting of an imidazolium cation, a pyridinium cation, a pyrrolidinium cation, an ammonium cation, and a phosphonium cation.

In one exemplary embodiment, the ionic liquid can include a cation having the formula:

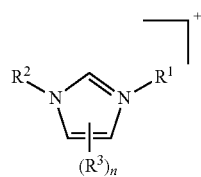

wherein $R^1$ is an optionally substituted $C_1$-$C_{20}$ alkyl, cycloalkyl, aralkyl, alkenyl, cycloalkenyl, or alkynyl group; $R^2$ is hydrogen or an optionally substituted $C_1$-$C_{20}$ alkyl, cycloalkyl, aralkyl, alkenyl, cycloalkenyl, or alkynyl group and $R^3$ is an optionally substituted $C_1$-$C_{12}$ alkyl, cycloalkyl, aralkyl, alkenyl, cycloalkenyl, or alkynyl group; and n is 0, 1, 2 or 3.

In another exemplary embodiment, the ionic liquid can include a cation having the formula:

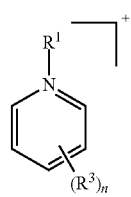

wherein $R^1$ is an optionally substituted $C_1$-$C_{20}$ alkyl, cycloalkyl, aralkyl, alkenyl, cycloalkenyl, or alkynyl group; $R^3$ is an optionally substituted $C_1$-$C_{12}$ alkyl, cycloalkyl, aralkyl, alkenyl, cycloalkenyl, or alkynyl group; and n is 0, 1, 2 or 3.

In another exemplary embodiment, the ionic liquid can include a cation having the formula:

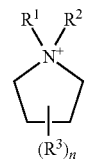

wherein $R^1$ and $R^2$, independently, are each an optionally substituted $C_1$-$C_{20}$ alkyl, cycloalkyl, aralkyl, alkenyl, cycloalkenyl, or alkynyl group; $R^3$ is an optionally substituted $C_1$-$C_{12}$ alkyl, cycloalkyl, aralkyl, alkenyl, cycloalkenyl, or alkynyl group; and n is 0, 1, 2 or 3.

In another exemplary embodiment, the ionic liquid can include a cation having the formula:

wherein $R^1$, $R^2$, $R^3$, and $R^4$, independently, are each an optionally substituted $C_1$-$C_{20}$ alkyl, cycloalkyl, aralkyl, alkenyl, cycloalkenyl, or alkynyl group.

In another exemplary embodiment, the ionic liquid can include a cation having the formula:

wherein $R^1$, $R^2$, $R^3$, and $R^4$, independently, are each an optionally substituted $C_1$-$C_{20}$ alkyl, cycloalkyl, aralkyl, alkenyl, cycloalkenyl, or alkynyl group.

In some exemplary embodiments, the ionic liquid can include a cation selected from the group consisting of a 1,3-dialkylimidazolium cation, a 1-alkylpyridinium cation, an N,N-dialkylpyrrolidinium cation, an tetraalkylammonium cation, and a tetraalkyl phosphonium cation.

In some exemplary embodiments, the ionic liquid can include a eutectic mixture. The eutectic mixture can include a quaternary ammonium salt and a hydrogen bonding partner.

The quaternary ammonium salt can include a cation having the formula:

wherein $R^1$, $R^2$, $R^3$, and $R^4$, independently, are each an optionally substituted $C_1$-$C_{20}$ alkyl, cycloalkyl, aralkyl, alkenyl, cycloalkenyl, or alkynyl group.

The quaternary ammonium salt can include a halide ion. The quaternary ammonium salt can be choline chloride. The hydrogen bonding partner can include a carboxylic acid, an amide, or a urea.

The hydrogen bonding partner can include a compound having the formula:

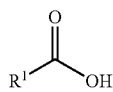

wherein $R^1$ is an optionally substituted $C_1$-$C_{20}$ alkyl, cycloalkyl, aralkyl, alkenyl, cycloalkenyl, or alkynyl group; or an optionally substituted $C_1$-$C_{10}$ aryl or heteroaryl group.

The hydrogen bonding partner can include a compound having the formula:

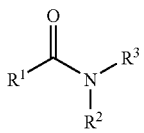

wherein $R^1$ is an optionally substituted $C_1$-$C_{20}$ alkyl, cycloalkyl, aralkyl, alkenyl, cycloalkenyl, or alkynyl group; or an optionally substituted $C_1$-$C_{10}$ aryl or heteroaryl group; and $R^2$ and $R^3$, independently, are each hydrogen or an optionally substituted $C_1$-$C_{20}$ alkyl, cycloalkyl, aralkyl, alkenyl, cycloalkenyl, or alkynyl group.

The hydrogen bonding partner can include a compound having the formula:

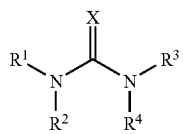

wherein X is O or S; and each of $R^1$, $R^2$, $R^3$, and $R^4$, independently, is an optionally substituted $C_1$-$C_{20}$ alkyl, cycloalkyl, aralkyl, alkenyl, cycloalkenyl, or alkynyl group; or an optionally substituted $C_1$-$C_{10}$ aryl or heteroaryl group.

In some exemplary embodiments, the surface can be contacted with the composition for a period of time ranging from 30 seconds to 30 minutes; 30 seconds to 2 minutes; or from 2 minutes to 30 minutes. In some exemplary embodiments, the surface can be contacted with the composition at a temperature between 20° C. and 70° C.; 20° C. and 50° C.; or 20° C. and 35° C.

The method can include rinsing the semiconductor substrate with water after contacting the semiconductor substrate with the composition. The method can include rinsing the semiconductor substrate with a solvent prior to rinsing the semiconductor substrate with water.

In some exemplary embodiments, the ionic liquid can be discharged toward the semiconductor substrate through at least one nozzle oriented at an angle between about 0° and about 45° with respect to the surface or oriented at an angle between about 0° and about 25° with respect to the surface. In one exemplary embodiment, the ionic liquid can be discharged toward the semiconductor substrate through at least one nozzle oriented at an angle no more than about 5° transverse to the surface.

In another aspect, the invention relates to a substrate cleaned according to the above-described methods, with the semiconductor substrate being a wafer in some embodiments.

In yet another aspect, the present invention relates to a method of cleaning a substrate that includes contacting a surface of a semiconductor substrate with a composition comprising a superacid. The superacid can include a mixture of $FSO_3H$, $SbF_5$, and $SO_2$; a mixture of HF and $BF_3$; or a mixture of $SbF_5$ and HF. The semiconductor substrate can include a photoresist. In some exemplary embodiments, the surface can be contacted with the composition for a period of time ranging from 30 seconds to 30 minutes; 30 seconds to 2 minutes; or from 2 minutes to 30 minutes. In some exemplary embodiments, the surface can be contacted with the composition at a temperature between 20° C. and 70° C.; 20° C. and 50° C.; or 20° C. and 35° C. In some exemplary embodiments, the superacid can be discharged toward the semiconductor substrate through at least one nozzle oriented at an angle between about 0° and about 45° with respect to the surface or oriented at an angle between about 0° and about 25° with respect to the surface. In one exemplary embodiment, the superacid can be discharged toward the semiconductor substrate through at least one nozzle oriented at an angle no more than about 5° transverse to the surface. In another aspect, the invention relates to a substrate cleaned according to this method, with the semiconductor substrate being a wafer in some embodiments.

In another aspect of the invention, a method of removing undesired material from a semiconductor wafer includes contacting the semiconductor wafer with a composition comprising an ionic liquid at a temperature and for a time sufficient to dislodge residue therefrom.

In a further aspect of the invention, a method of removing undesired material from a semiconductor wafer comprises contacting the semiconductor wafer with a composition comprising a superacid at a temperature and for a time sufficient to dislodge residue therefrom.

The invention also relates to a method of removing undesired material from a semiconductor wafer comprising contacting the semiconductor wafer with a composition comprising a superacid at a temperature and for a time sufficient to strip photoresist therefrom.

The invention further relates to an integrated circuit fabrication process including: etching a semiconductor layer on a wafer; applying a superacid to the wafer to remove residues from the etching; rinsing the wafer with water.

In addition, the invention relates to a process for removing residue from an integrated circuit, which includes contacting the integrated circuit with a composition comprising an ionic liquid at a temperature and for a time sufficient to remove the residue from the integrated circuit.

And, the invention relates to a process for removing residue from an integrated circuit, which includes contacting the integrated circuit with a composition comprising a superacid at a temperature and for a time sufficient to remove the residue from the integrated circuit.

The present invention further relates to a method of modifying a surface, the method including: directing a plurality of nano-clusters toward the surface in generally atmospheric conditions; impacting the nano-clusters proximate the surface. In some embodiments, the nano-clusters may include propylene carbonate or TMAH. Also, in some embodiments the nano-clusters include an ionic liquid and an oxidizer. The ionic liquid and oxidizer may be mixed just prior to directing the nano-clusters toward the surface. The method may further include: permitting the nano-clusters to decompose within between about 10 minutes and about 1 second of contacting the surface. The nano-clusters may impact the surface in a positive pressure atmosphere. Each nano-cluster may have a size between about 4 nm and about 12 nm before impacting proximate the surface. Also, the nano-clusters may be directed toward the surface in the form of a plasma. The method may further include: breaking apart the nano-clusters proximate the surface; and encapsulating a particle initially disposed on the surface in the broken apart nano-clusters.

DETAILED DESCRIPTION OF THE PREFERRED EMBODIMENTS

In an exemplary preferred embodiment of the present invention, a liquid composition is contacted with a surface to remove undesired material from the surface. Undesired material can be any material that interferes with the ultimate function of the surface. When the surface includes a semiconductor substrate (e.g., a wafer), undesired material can include, for example, resist residues or metal ions. The composition can be useful in applications such as coating, plating, imaging, surfacing, processing, cleaning and sterilization. In some embodiments, the liquid composition includes an aqueous chemistry. Although the present invention is readily applicable to the semiconductor industry (e.g., for submicron cleaning of wafers), it is not limited to use with any particular industry and instead may be applied in a wide variety of technology areas requiring the removal of contaminants to a very fine scale (e.g., nearly to the molecular level).

In an exemplary preferred embodiment of the present invention, a substrate in the form of a semiconductor wafer may have undesired material on surface(s) thereof such as post etch residue from aluminum- or copper-based technologies. The wafer can be contacted with a desired chemistry, for example, by immersion on a wet bench, e.g. a wet bench manufactured by Semitool or Tokyo Electron (TEL), or by a spray tool. The spray tool, for example, may be obtained from SEZ or Dainippon Screen Manufacturing Co. Ltd. (DNS) and the spray tool may be a single wafer spray tool. The process time, which depends on the equipment used, can be between 30 seconds and 30 minutes, such as for example, between 30 seconds and 2 minutes, or between 2 minutes and 30 minutes. The process temperature can be between 20° C. and 70° C., preferably between 20° C. and 50° C., or more preferably between 20° C. and 35° C. After cleaning, the wafer may be rinsed, either with water, or first with a solvent such as an organic solvent N-methylpyrrolidone (NMP), isopropyl alcohol (IPA), or dimethyl sulfoxide (DMSO), followed by a final rinse with water.

In one exemplary method according to the present invention, the following steps may be employed: etching, ashing and/or application of wet chemistry to remove photoresist and/or etch residues; rinse with carbonated water, NMP, IPA, or DMSO to remove and/or neutralize debris and remaining wet chemistry from the etched surface; and finally a deionized (DI) water rinse.

Preferably the wet chemistry can be captured after use and used again in additional cleaning cycles. The chemistry can be reused until the level of impurities in the chemistry exceeds a predetermined level.

Nano-clusters of the chemistry may be formed and charged with atmospheric inert gases in the liquid flow. The nano-clusters may expand and then impinge on a substrate surface, removing surface particles that may be larger than the nano-clusters themselves. In some embodiments, particles ranging from about 5 microns to less than about 4 nm may be removed from a substrate. In some exemplary embodiments, the clusters may travel at super-sonic speeds.

In general, the wet chemistry of the present invention may be a composition that includes a solvent and optionally one or more additional components mixed with or dissolved in the solvent. The solvent can be, for example, a halogenated solvent, an aprotic solvent, a protic solvent, an organic acid, an alkanolamine, an alcohol, an amide, an ester, a dipolar aprotic solvent, an ether, a quaternary amine, a cyclic amine, a perfluorinated compound, an aliphatic ester, an inorganic acid, or an inorganic base. Exemplary solvents of these classes are listed in Table 1. The solvent can include an ionic liquid. The solvent can include a mixture of solvents, such as, for example, a mixture of a polar solvent with a protic solvent, a mixture of two distinct protic solvents, or a mixture of a polar solvent with an ionic liquid. The composition can include a superacid. An ionic liquid can be used in a neat or substantially pure form. In other words, the ionic liquid can be used for substrate cleaning without adding any additional materials to the ionic liquid. A superacid can be diluted before use, for example, in the range of 2-10% by weight.

TABLE 1

| Name | Solvent Class | Molecular Formula | CAS # | B.P. | Fr. P. | Flash P. | Density | Surface Tension dynes/cm | Dielectric Constant | Viscosity cp |
|---|---|---|---|---|---|---|---|---|---|---|
| Chloroform | Halogenated solvent | CHCl3 | 67-66-3 | 61 | −64 | na | 1.493 | 27.5 | 4.81 | 0.58 |
| Formamide | Aprotic solvent | CH3NO | 75-12-7 | 210.5 | 2.6 | 154 | 1.133 | 57.6 | 84 | 1.4 |
| N-Methyl formamide | Aprotic solvent | C2H4NO | 123-39-7 | 182.5 | −3.8 | 98 | 1.018 | | 182.4 | 1.7 |
| Acetic acid | Organic acid | C2H4O2 | 64-19-7 | 117.9 | 16.7 | 40 | 1.044 | 27.4 | 6.15 | 1.13 |
| Acetonitile | Aprotic solvent | C2H3N | 75-05-8 | 81 | −47 | 5 | 0.786 | 28.9 | 37.5 | 0.345 |
| 1,2 Dichloro ethane | Halogenated solvent | C2H4Cl2 | 107-06-2 | 83 | −35 | 15 | 1.256 | 33.3 | 10.4 | 0.74 |
| Glycolic acid | Organic acid | C2H4O3 | 79-14-1 | 112 | 10 | na | 1.27 | | −30 | 11.3 |
| 2-Aminoethanol | Alkanolamine | C2H7NO | 141-43-5 | 169 | 10 | 93 | 1.013 | 48.9 | 37.7 | |
| Dimethyl sulfoxide | Aprotic solvent | C2H6SO | 67-68-5 | 189 | 18.5 | 95 | 1.095 | 43 | 46.7 | 1.99 |
| Ethylene Carbonate | Polar solvent | C3H4O3 | 96-49-1 | 238 | 36.4 | 160 | 1.32 | 43.9 | 89.6 | 0.99 |
| Acetone | Aprotic solvent | C3H6O | 67-64-1 | 56.2 | −95.4 | <−20 | 0.79 | 25.2 | 20.7 | 0.32 |
| Isopropyl alcohol | Alcohol | C3H7O | 67-63-0 | 82.4 | −88 | 12 | 0.79 | 23 | 19.9 | 2.43 |
| N,N Dimethyl formamide | Amide | C3H7NO | 68-12-2 | 152 | −61 | 57 | 0.946 | 35.2 | 36.7 | 0.8 |
| g-Butyrolactone | Ester | C4H6O2 | 96-48-0 | 204 | 143. | 98.3 | 1.125 | 40.4 | 39 | 1.73 |
| Propylene carbonate | Polar solvent | C4H7O3 | 108-32-7 | 242 | −49 | 135 | 1.2 | 40.9 | 64 | 2.5 |
| Methyl ethyl ketone | Aprotic solvent | C4H8O | 78-93-3 | 79.6 | −86.7 | −3 | 0.805 | 24.6 | 18.5 | |
| Butyric acid | Organic acid | C4H8O2 | 107-92-6 | 163.3 | −5.2 | 76 | 0.96 | 26.8 | 2.97 | 1.53 |
| Sulfolane | Dipolar aprotic solvent | C4H8O2S | 126-33-0 | 287.3 | 28.5 | 166 | 1.26 | 50.9 | 43.3 | 11.6 |
| N,N Dimethyl acetamide | Amide | C4H9NO | 127-19-5 | 165 | −20 | 70 | 0.938 | 33.5 | 37.8 | 0.93 |
| Propylene Glycol Me ether | Ether | C4H10O2 | 111-77-3 | 120 | −97 | 31 | 0.921 | 27.7 | | 1.7 |

TABLE 1-continued

| Name | Solvent Class | Molecular Formula | CAS # | B.P. | Fr. P. | Flash P. | Density | Surface Tension dynes/cm | Dielectric Constant | Viscosity cp |
|---|---|---|---|---|---|---|---|---|---|---|
| Digylcolamine (DGA) | Alkanolamine | C4H11NO2 | 929-06-6 | 221 | 111 | 127 | 1.053 | 44.4 | | 26.2 |
| TMAH (25%) | Quaternary amine | C4H13NO | 75-59-2 | 100 | <−25 | >200 | 1.016 | | | 2.8 |
| N-Methylpyrrolidone | Amide | C5H9NO | 872-50-4 | 202 | −24.4 | 86 | 1.028 | 40.1 | 32 | 1.65 |
| Morpholine | Cyclic amine | C5H11N | 110-91-8 | 129 | −7 | 35.5 | 0.995 | 36.9 | 7.42 | 2.04 |
| 1,5 Pentanediol | Alcohol | C5H12O2 | 111-29-5 | 242 | −16 | 129 | 0.992 | 43.3 | 26.2 | |
| Vertrel XF | perfluorinated cmpd | C5H2F10 | | 55 | | na | 1.58 | 14-19 | 7-10 | 0.67 |
| Lactic acid, Butyl ester | Aliphatic ester | C7H14O3 | 138-22-7 | 186 | −43 | 79 | 0.98 | 28 | 5.1 | 3.22 |
| Dipropylene glycol Me ether | Ether | C7H15O3 | 34590-94-8 | 190 | −83 | 75 | 0.953 | 28.8 | | 3.7 |
| Sulfuric acid | Inorganic acid | H2SO4 | 7664-93-9 | 327 | −2 | na | 1.84 | 73.5 | 100 | 21.2 |
| Hydroxylamine | Inorganic base | NH3O | 7803-49-8 | 107 | 7 | na | 1.12 | | | |
| Water | Polar solvent | H2O | 7732-18-5 | 100 | 0 | na | 1 | 72.8 | 78.5 | 0.9 |

Ionic liquids can have advantageous environmental properties over other solvents. Ionic liquids are substantially nonvolatile. Some ionic liquids are biodegradable. Ionic liquids can be less toxic than other solvents, or even non-toxic.

In some circumstances, organic photoresist polymers become at least partially carbonized after the substrate is subjected to an ion implant step. The at least partially carbonized photoresist can be difficult to remove, but failing to remove it may interfere with further substrate processing. Superacids may be used to remove such photoresists from a substrate.

Thus, discussed next are ionic liquids and superacids for use as the wet chemistry for substrate cleaning in accordance with the present invention.

An ionic liquid includes cations (positively charged species) and anions (negatively charged species), and has a melting point at or below 100° C. For example, an ionic liquid can include an organic cation such as a 1,3-dialkylimidazolium, a 1-alkylpyridinium, an N,N-dialkylpyrrolidinium, an ammonium, or a phosphonium cation. A wide range of anions can be employed, such as, for example, a halide (e.g., chloride), an inorganic anion (e.g., tetrafluoroborate or hexafluorophosphate), or an organic anion (e.g., bis-trifluorsulfonimide, triflate, or tosylate). As one example, the melting point of 1-butyl-3-methylimidazolium tetrafluoroborate is about −71° C.; this compound is a colorless liquid with high viscosity at room temperature. Additional exemplary ionic liquids are listed in Table 2.

TABLE 2

Exemplary Ionic Liquids 1-ethyl-3-methylimidazolium methanesulfonate
methyl-tri-n-butylammonium methylsulfonate
1-ethyl-2,3-dimethylimidazolium ethylsulfonate
1-butyl-3-methylimidazolium ethylsulfate
1-butyl-3-methylimidazolium methanesulfonate
1-ethyl-3-methylimidazolium chloride
1,2,3-trimethylimidazolium methylsulfate
1-butyl-3-methylimidazolium tetrachloroaluminate
1-ethyl-3-methylimidazolium tetrachloroaluminate
1-ethyl-3-methylimidazolium hydrogensulfonate
1-butyl-3-methylimidazolium hydrogensulfonate
methylimidazolium hydrogensulfonate
methylimidazolium chloride
1-ethyl-3-methylimidazolium acetate
1-butyl-3-methylimidazolium acetate
1-ethyl-3-methylimidazolium ethylsulfate
1-ethyl-3-methylimidazolium methylsulfate
1-ethyl-3-methylimidazolium thiocyanate
1-butyl-3-methylimidazolium thiocyanate
1-butyl-3-methylimidazolium chloride
1-butyl-3-methylimidazolium hexafluorophosphate TABLE 2-continued Exemplary Ionic Liquids 1-ethyl-3-methylimidazolium tetrafluoroborate
1-butyl-3-methylimidazolium tetrafluoroborate
1-butyl-2,3-dimethylimidazolium chloride
1-methyl-3-octylimidazolium trifluoromethanesulfonate
1-hexyl-3-methylimidazolium trifluoromethanesulfonate
1-hexyl-3-methylimidazolium tetrafluoroborate
1-methyl-3-octylimidazolium hexafluorophosphate Advantageously, ionic liquids are often colorless, poorly coordinating, and have substantially no vapor pressure, and can effectively dissolve residues. High solubility of residues in ionic liquids allows process intensification. In other words, only low liquid volumes are required in the treatments, thereby permitting a substantial reduction in the amount of chemical required to produce the desired result. The reduced amount of chemical that is used makes ionic liquid-based cleaning an environmentally friendly substrate cleaning process.

Suitable cations for ionic liquids can include, for example, an imidazolium cation having the formula:

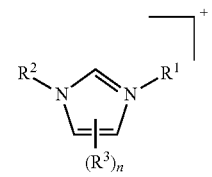

where $R^1$ is an optionally substituted $C_1$-$C_{20}$ alkyl, cycloalkyl, aralkyl, alkenyl, cycloalkenyl, or alkynyl group; $R^2$ is hydrogen or an optionally substituted $C_1$-$C_{20}$ alkyl, cycloalkyl, aralkyl, alkenyl, cycloalkenyl, or alkynyl group and $R^3$ is an optionally substituted $C_1$-$C_{12}$ alkyl, cycloalkyl, aralkyl, alkenyl, cycloalkenyl, or alkynyl group; and n is 0, 1, 2 or 3. In some embodiments, $R^1$ can be $C_1$-$C_6$ alkyl and $R^2$ can be methyl. $R^1$ or $R^2$ can be optionally substituted by a polar or protic substituent, such as, for example, hydroxy. The pyrrolidinium cation can be an N,N-dialkylpyrrolidinium.

Another suitable cation is a pyridinium ion having the formula:

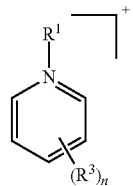

where $R^1$ is an optionally substituted $C_1$-$C_{20}$ alkyl, cycloalkyl, aralkyl, alkenyl, cycloalkenyl, or alkynyl group; $R^3$ is an optionally substituted $C_1$-$C_{12}$ alkyl, cycloalkyl, aralkyl, alkenyl, cycloalkenyl, or alkynyl group; and n is 0, 1, 2 or 3. In some embodiments, $R^1$ can be $C_1$-$C_8$ alkyl. $R^3$ can be $C_1$-$C_6$ alkyl. The pyridinium ion can be N-alkyl pyridinium ion.

Another suitable cation is a pyrrolidinium ion having the formula:

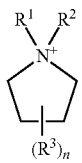

where $R^1$ and $R^2$, independently, are each an optionally substituted $C_1$-$C_{20}$ alkyl, cycloalkyl, aralkyl, alkenyl, cycloalkenyl, or alkynyl group; $R^3$ is an optionally substituted $C_1$-$C_{12}$ alkyl, cycloalkyl, aralkyl, alkenyl, cycloalkenyl, or alkynyl group; and n is 0, 1, 2 or 3. In some embodiments, $R^1$ and $R^2$ are each independently $C_1$-$C_6$ alkyl. $R^1$ can be methyl and $R^2$ can be $C_1$-$C_6$ alkyl. The pyrrolidinium ion can be an N,N-dialkylpyrrolidinium ion.

Another suitable cation is an ammonium, such as a quaternary ammonium ion having the formula:

where $R^1$, $R^2$, $R^3$, and $R^4$, independently, are each an optionally substituted $C_1$-$C_{20}$ alkyl, cycloalkyl, aralkyl, alkenyl, cycloalkenyl, or alkynyl group. In some embodiments, $R^1$, $R^2$, $R^3$, and $R^4$, independently, are each $C_1$-$C_8$ alkyl. $R^1$ or $R^2$ can be optionally substituted by a polar or protic substituent, such as, for example, hydroxy. The ammonium ion can be a tetraalkylamnonium ion.

Another suitable cation is a phosphonium ion having the formula:

where $R^1$, $R^2$, $R^3$, and $R^4$, independently, are each an optionally substituted $C_1$-$C_{20}$ alkyl, cycloalkyl, aralkyl, alkenyl, cycloalkenyl, or alkynyl group. In some embodiments, $R^1$, $R^2$, $R^3$, and $R^4$, independently, are each $C_1$-$C_8$ alkyl. The phosphonium ion can be a tetraalkylphosphonium ion.

Suitable anions for an ionic liquid include a halide (e.g., fluoride, chloride, bromide, or iodide), a sulfate, a sulfonate, a carboxylate (e.g., acetate or propionate), a sulfonimide (e.g., bis(trifluoromethylsulfonyl)imide), a phosphinate (e.g., bis(2,4,4-trimethylpentyl)phosphinate), a phosphate (e.g., tris(pentafluoroethyl)trifluorophosphate) an inorganic anion (e.g., tetrafluoroborate, hexafluorophosphate, or tetrachloroaluminate), thiocyanate, or dicyanamide.

A sulfate can have the formula:

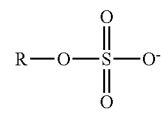

where R is $C_1$-$C_{20}$ alkyl, haloalkyl, cycloalkyl, aralkyl, alkenyl, cycloalkenyl, alkynyl, or aryl group. For example, R can be methyl, trifluoromethyl, p-tolyl, ethyl, n-butyl, n-hexyl, or n-octyl.

A sulfonate can have the formula:

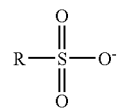

where R is $C_1$-$C_{20}$ alkyl, haloalkyl, cycloalkyl, aralkyl, alkenyl, cycloalkenyl, alkynyl, or aryl group. For example, R can be methyl, trifluoromethyl, p-tolyl, ethyl, n-butyl, n-hexyl, or n-octyl.

The ionic liquid can include a eutectic mixture. In general, a eutectic mixture is a mixture of two or more pure materials in a particular ratio that displays a reduced melting point compared to either material in a pure state. The eutectic mixture can be substantially free of metals ions. For example, the eutectic can be a mixture of organic compounds. The eutectic mixture can be a deep eutectic solvent. The eutectic mixture can be a mixture of a quaternary ammonium salt and a hydrogen-bonding partner. The quaternary ammonium salt also can be a halide salt, i.e., a salt of a quaternary ammonium ion and a halide ion, such as fluoride, chloride, bromide or iodide. The quaternary ammonium salt can be choline chloride. The hydrogen-bonding partner can be, for example, a carboxylic acid, an amide, or a urea. See, for example, Freemantle, M., *Chem. Eng. News* Sep. 12, 2005, 36-38; Abbott, A. P. et al., *Chem. Comm.* Jan. 7, 2003, 70-71; and Abbott, A. P. et al., *J. Am. Chem. Soc.* 2004, 126, 9142-9147, each of which is incorporated herein by reference in its entirety.

The quaternary ammonium salt can include a quaternary ammonium ion having the formula:

where $R^1$, $R^2$, $R^3$, and $R^4$, independently, are each an optionally substituted $C_1$-$C_{20}$ alkyl cycloalkyl, aralkyl, alkenyl, cycloalkenyl, or alkynyl group. In some embodiments, $R^1$ is hydroxyl substituted $C_1$-$C_8$ alkyl, $R^2$, $R^3$, and $R^4$, independently, are each $C_1$-$C_8$ alkyl. $R^1$ can be hydroxyl substituted $C_2$ alkyl and $R^2$, $R^3$ and $R^4$ can each be methyl.

The hydrogen bonding partner can be a carboxylic acid having the formula:

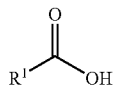

where $R^1$ is an optionally substituted $C_1$-$C_{20}$ alkyl, cycloalkyl, aralkyl, alkenyl, cycloalkenyl, or alkynyl group; or an optionally substituted $C_1$-$C_{10}$ aryl or heteroaryl group. The carboxylic acid can be selected from the group of adipic acid, benzoic acid, citric acid, malonic acid, oxalic acid, phenylacetic acid, phenylpropionic acid, succinic acid, and tricarballylic acid.

The hydrogen bonding partner can be an amide having the formula:

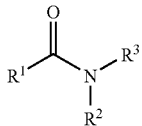

where $R^1$ is an optionally substituted $C_1$-$C_{20}$ alkyl, cycloalkyl, aralkyl, alkenyl, cycloalkenyl, or alkynyl group; or an optionally substituted $C_1$-$C_{10}$ aryl or heteroaryl group; and $R^2$ and $R^3$, independently, are each hydrogen or an optionally substituted $C_1$-$C_{20}$ alkyl, cycloalkyl, aralkyl, alkenyl, cycloalkenyl, or alkynyl group.

The hydrogen bonding partner can be a urea having the formula:

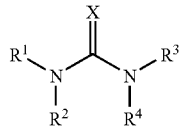

where X is O or S; and each of $R^1$, $R^2$, $R^3$, and $R^4$, independently, is an optionally substituted $C_1$-$C_{20}$ alkyl, cycloalkyl, aralkyl, alkenyl, cycloalkenyl, or alkynyl group; or an optionally substituted $C_1$-$C_{10}$ aryl or heteroaryl group.

The composition can include an acid. In some embodiments, the acid can be a superacid, i.e., an acid with a greater proton-donating ability than 100% sulfuric acid. One well known example of a superacid is a mixture of $FSO_3H$—$SbF_5$—$SO_2$, sometimes referred to as "magic acid." Another superacid is a mixture of HF and $BF_3$. Still another is a mixture of $SbF_5$ and HF.

The chemistries can have a dielectric constant selected to support an electric charge. In a preferred, exemplary embodiment, the nano-clusters preferably are provided with sufficient velocity to mechanically dislodge surface particulate on substrates, while also chemically interacting with such particulate for example to lower surface adhesion. In some embodiments, the nano-clusters can include an ionic liquid and an oxidizer that interact with a high pH material. Such a combination preferably has a short life before decomposing, such as trimethylphenylammonium hydroxide (TMPAH) or tetramethylammonium hydroxide (TMAH) combined with propylene carbonate. In an exemplary process for use with the present invention, the ionic liquid and oxidizer may be mixed at the point-of-use, e.g., just prior to or during formation of nano-clusters. Such instantaneously-reactive removal chemistries are preferred for use with the present invention. In some preferred exemplary embodiments, the chemistries may be stable for about 1 hour or less prior to decomposition. In other exemplary embodiments, the chemistries may be stable for about 1 minute or less prior to decomposition. In yet other exemplary embodiments, the chemistries may be stable for 10 seconds or less prior to decomposition. And in other exemplary embodiments, the chemistries may be stable for 1 second or less.

A number of suitable ionic liquids are commercially available, for example, from Sigma-Aldrich (St. Louis, Mo.), or Merck KGaA (Darmstadt, Germany).

The composition can include a conductivity enhancing compound. The conductivity enhancing compound can include a preferably volatile salt. For example, an ammonium salt such as a ammonium acetate or ammonium carbonate may be used to impart conductivity to the liquid. Other suitable salts include non-volatile alkali metal salts such as NaI, KI, and CsI. Preferably, the concentration of salt in the liquid is about 0.1 normal to 2.0 normal.

The composition can include an oxidizer. The oxidizer can assist in the chemical removal of targeted material on the substrate surface. Preferably, the amount of oxidizer used to prepare the clusters is sufficient to assist the removal process, while being as low as possible to minimize handling, environmental, or similar or related issues, such as cost.

Hydroxylamine compounds, depending on pH, can be either an oxidizer or a reducing agent. In one exemplary embodiment, the hydroxylamine compound can be an oxidizer. For example, the hydroxylamine compound can be hydroxylamine, a salt of hydroxylamine, a derivative of hydroxylamine, a salt of a derivative of hydroxylamine, or a combination thereof. The hydroxylamine compound may be organic or inorganic. Preferably, the hydroxylamine compound has formula:

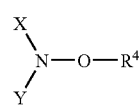

where $R^4$ is hydrogen or a linear, branched, or cyclic $C_1$-$C_7$ hydrocarbon group; and where X and Y are, independently, hydrogen or a linear, branched, or cyclic $C_1$-$C_7$ hydrocarbon group, or wherein X and Y are linked together form a nitrogen-containing heterocyclic $C_4$-$C_7$ ring.

Examples of hydroxylamine compounds include hydroxylamine, N-methyl-hydroxylamine, N,N-dimethyl-hydroxylamine, N-ethyl-hydroxylamine, N,N-diethyl-hydroxylamine, methoxylamine, ethoxylamine, N-methyl-methoxylamine, and the like. Hydroxylamine and its derivatives, as defined above, are available as salts, e.g., sulfate salts, nitrate salts, phosphate salts, or the like, or a combination thereof.

The oxidizer can include an inorganic or organic per-compound. A per-compound is generally defined as a compound containing an element in its highest state of oxidation, such as perchloric acid; or a compound containing at least one peroxy group (—O—O—), such as peracetic acid and perchromic acid. Suitable per-compounds containing at least one peroxy group include, but are not limited to, urea hydrogen peroxide, a monopersulfate, a dipersulfate, peracetic acid, a percarbonate, and an organic peroxide, such as benzoyl peroxide or di-t-butyl peroxide. For example, ozone is a suitable oxidizer either alone or in combination with one or more other suitable oxidizers. The per-compound can be hydrogen peroxide.

Suitable per-compounds that do not contain a peroxy group include, but are not limited to, periodic acid, any periodate salt, perchloric acid, any perchlorate salt, perbromic acid, and any perbromate salt, perboric acid, and any perborate salt.

Exemplary inorganic oxidizers include peroxymonosulfuric acid, potassium peroxymonosulfate, and ammonium peroxymonosulfate. Other oxidizers are also suitable; for example, iodates are useful oxidizers, and oxone is a useful oxidizer.

The oxidizer may be a salt of a metal having multiple oxidation states, a complex or coordination compound of a metal having multiple oxidation states, or any combination thereof, provided the compound has a sufficient oxidative potential to oxidize the substrate. Examples include permanganate or salts thereof and perchromate or salts thereof, iron salts, aluminum salts, cerium salts, and the like. When mixed with another common oxidizer such as hydrogen peroxide in a solution, the salts and oxidizer react and the oxidizing capacity of the mixture may decline with time. It is known that if the pH is above about 5, iron precipitates as $Fe(OH)_3$ and catalytically decomposes the hydrogen peroxide to oxygen. At a pH of below about 5, a solution of hydrogen peroxide and an iron catalyst is known as Fenton's reagent.

One disadvantage of metal-containing oxidizer salts is that they can leave metal contamination on the substrate. This metallic contamination can result in shorts and spurious conductive properties, along with other problems. Certain metals, such as those with a tendency to plate on or be absorbed on to at least one part of the substrate, may be more damaging than other metals. In one embodiment, the total weight of the metal present in the liquid used to make the clusters is less than 1 percent, less than 0.5 percent, less than 0.2 percent, less than 0.05 percent, less than 0.02 percent or less than 0.005 percent relative to the weight of the liquid. Clusters of the invention may be essentially free of metals, for example, completely free of metals. By essentially free of metals it is meant that the total weight of metal present in the liquid used to generate the clusters is less than 0.25 percent relative to the weight of the liquid.

Preferred solvents are listed in Table 1. An exemplary preferred solvent is propylene carbonate.

Residual removers for cleaning of semiconductors are known, for example, from U.S. Patent Application Publication No. 2004/0217006 A1, the entire content of which is expressly incorporated herein by reference thereto.

In some exemplary embodiments of the present invention, the wet chemistry may include one or more of the following: chelators, surfactants (nonionics, anionics, and/or cationics), abrasives, water, other solvents, corrosion inhibitors, basic amine compounds, acids and bases.

One exemplary method of cleaning a substrate using the cleaning compositions of the present invention comprises: contacting the substrate having residue thereon, e.g. organometallic or metal oxide residue, with a cleaning composition that includes an ionic liquid or superacid for a time and at a temperature sufficient to remove the residue. The substrate may be generally immersed in the cleaning composition.

In another exemplary method in accordance with the present invention, photoresist is stripped from a substrate using a method comprising: contacting the substrate having photoresist thereon with a composition that includes an ionic liquid or superacid for a time and at a temperature sufficient to remove the photoresist. The substrate may be generally immersed in the photoresist stripping composition.

In yet another exemplary method in accordance with the present invention, metal or oxide is etched in a method comprising: contacting the metal or oxide with an etching composition that includes an ionic liquid or superacid for a time and at a temperature sufficient to etch said metal or oxide. The metal or oxide may be generally immersed in the etching composition.

In some exemplary embodiments, the composition of the present invention can be selectively applied to the substrate, that is, applied to only to a predetermined region of the substrate. Selective application of the composition can be achieved, for example, by applying the composition with an ink jet printer.

In some exemplary embodiments of the present invention, chemistry may be delivered to a surface in the form of nano-clusters. The molecular structure of nano-clusters, as dispersed clouds with sizes between about 4 nm and about 12 nm, and in some embodiments preferably less than about 8 nm, provide a dry process environment for processing accuracy to atomic layer definition. In order to produce the nano-clusters and deliver them to the substrate, a nozzle may be used with sufficient charge at the nozzle via extractor electrodes. The resultant high-speed nano-clusters emitted under charge must then have the bonds broken down that hold the nano-clusters together. This may be accomplished with a mini discharge/dispersal field that completely eliminates charge, reduces the size of the nano-clusters for example from about 80 nm to between about 4 nm and about 12 nm (such as about 8 nm), and "aims" the nano-clusters. A plasma of nano-clusters may be created as a directed flow to the substrate without the physical size or force of the original nano-clusters.

In some embodiments, a clean cell preferably integrates with a gate interface and robotic handling mechanisms of a Semitool Mini-Raider platform. Also, in some embodiments, only one side of the wafer may be processed, while in other embodiments both sides are processed.

The clean cell, preferably formed of polyethylene therephthalate (PET), preferably has a positive pressure of purified atmosphere and/or inert gas (such as nitrogen) and has, as a means of withdrawing the contaminants, a side-flow evacuation system with upward-evacuation, and low vacuum withdrawal to plasmatic reclaim. The sub chamber (discharge/dispersal field), via the supersonic movement of nano-cluster plasma, may create a windmill effect that lifts the evacuant back to the vacuum or output port/reclaim above the surface interface. Redeposition may be avoided by the windmilling effect of the plasma directing the evacuants to the output port(s) and/or the use of common heavy gas laminar flow technology.

Preferably, the chamber supports atmospheric and positive-pressure gas environments, and the output port is either an evacuation for positive pressure atmospheric or gas atmosphere processing. In the low positive pressure gas environment, the gas is ionized to create the discharge and dispersal of the nano-clusters. Further, the gas may be blended to collect and evacuate the residual to a reclaim plasma filter for re-use of the gas. The array may be waferscale as a pattern of emitters angled toward evacuation port(s). This technique with a slowly revolving wafer (16-32 rpm) may produce higher throughputs above 200 Wph.

In some embodiments, a solvated atmospheric flow from a center point above the nozzle(s) to low-draw vacuum evacuation at the side(s) of the platen may add to encapsulation and suspension of the particles and residuals because the atmosphere is heavier and its flow can carry micro particles more thoroughly to the exhaust vacuum ports. In some embodiments, the solvated atmosphere may be ionized to more rapidly discharge the nano-clusters for dispersal using IR or UV ionizing methods. In some embodiments, subsonic or supersonic spray applications may rely on the momentum of small droplets without the need for ionization. The size, discharge and dispersal of the nano-clusters may be controlled by the height of the nozzle tip above the surface interface. Also, the nozzle preferably may have a conical tip like a blunderbuss so the nano-clusters have a broader spectrum or pattern array. And, the formulations of chemistry may be selected as a function of charge retention capabilities (e.g., dielectric constant) in addition to their reaction rates and surface effects for desired specific discharge and reaction. In a preferred exemplary embodiment the nozzle's patterns preferably overlap in a single row, "like lawn sprinklers" to keep the nano-clusters traveling toward the surface. A gap preferably may be provided row to row in order to allow the encapsulated particles and residuals to move out of the pattern and into the evacuation stream.

In some exemplary embodiments of the present invention, wet chemistry may be delivered to the substrate at an angle between about 0° and about 90°; between about 0° and about 45°; or between about 0° and about 25° with respect to the surface of the substrate. The wet chemistry may be delivered through nozzles that all are oriented at about the same angle with respect to the substrate or alternatively through nozzles oriented at a plurality of angles with respect to the substrate. Moreover, the wet chemistry may be delivered at speeds that are subsonic or supersonic. In one exemplary embodiment, a cleaning chemistry is delivered to the substrate through nozzles oriented almost parallel to the substrate. For example, the nozzles may be oriented no more than about 5° transverse to the substrate surface; no more than about 3° transverse to the substrate surface; or no more than about 1° transverse to the substrate surface.

Preferably, particles may be removed down to the detection limit of a scanning electron microscope of 8 nm and to the detection limits of a Surfscan at 50 ppb.

At present, prior art batch and single wafer processors use chemistry with volumes of water creating a significant waste stream and reclaim issue for recycling or discharging water. Vapor of the present invention may be produced using UNIT Delivery Systems chemistry (UDS) that delivers ready-to-use chemistry to the equipment in a clean interface container, and removes the output of the machine for convenient collection for reclaim as 50 to 100 times less reclaim volume than standard processor production. The successful integration of the two technologies permits a "bolt-on" final finish and dry unit that reduces both waste water and chemistries by two orders of magnitude, and increases the level of "soft-touch" contamination removal by over one order of magnitude.

The present invention may be applied to such fields as semiconductor manufacturing, nanotechnologies, medical sterilization technologies, MEMS, MOEMS, and many other processes.

A replacement of IPA with fugitive alcohols may facilitate the elimination of hydrocarbon contamination in the cleaning steps.

In an exemplary preferred embodiment, the present invention may be used in connection with wafers between about 150 mm and about 450 mm. In alternate embodiments, the present invention may be used for smaller wafer sizes such as those used in the hard disk industry in sizes of about 2.5 inches to about 3 inches.

In some embodiments of the present invention, other surface deposition techniques may be used such as disclosed in U.S. Pat. No. 6,817,385, the entire content of which is incorporated herein by reference thereto.

In some embodiments, the chemistries contemplated in the present invention may be dispensed from a cassette having up to 10 chemistries, and more preferably 5 to 10 chemistries, configured with valving that could either allow one chemistry or a mixture of several chemistries to occur just prior to injection into the chamber. Such mixing (instead of sequential injections of chemistries) may allow, for example, the mixing of a surfactant with a reactive chemistry for better surface contact and reactivity.

With the present invention, an expanded process window thus may be provided for cleaning a variety of residues encountered in the semiconductor industry. The expanded window includes chemistries and chemistry concentrations to promote release of residues and particles. In the preferred exemplary embodiment, the chemical concentrations and application time can be significantly reduced over prior art processes and more aggressive chemistries may be used for more precise process control. Vapor spray technology may permit very quick removal of gross particles and residues.

One concept for post-process drying involves sub-critical gas or liquid spray for waferscale processing. Another concept for post-process drying may involve an accelerated gas or liquid with an induced plasma. A near-dry process may be provided and may have residual, trace moisture as nanoclusters in the pattern or porosity.

To prevent residual water from being left on the surface in a single-wafer system, a positive-pressure chamber can be purged by turning off the chemistry for 4-7 seconds prior to wafer unload and increasing positive atmospheric flow in the chamber. However, doing so may fail to vacate trace moisture in porosity (dielectrics, etc.), and can actually impound the moisture. Instead, heated inert gas may be added to the expanding blended sub-critical gas flow, which reduces the positive atmospheric flow. The combination of sub-critical-gas accelerated plasma and thermal dynamic gas may dry without moisture expansion/explosion, which can cause delamination of wafer layers or water spots.

Inert gas is a gas that does not react substantially with the surface, such as helium, neon, argon, or nitrogen. For certain applications (i.e., where oxide formation is of no significance), purified atmosphere can be acceptable. The inert gas can be introduced at an elevated temperature, i.e., higher than ambient temperature. The elevated temperature can be, for example, between 50° C. and 100° C., between 70° C. and 90° C., or about 80° C. At this time, chemistry flow is maintained to evacuate heavy molecular contamination. The chemistry can include an oppositely charged chelator or surfactant running at between 0.1% and 1.0%, e.g., about 0.5%, to encourage removal of contaminants from porosity.

Advantageously, application areas for the cleaning technology of the present invention include:

1. Wet-to-Dry processes for gaining a more specific control of the chemical cleaning process and drying of a substrate, having particular importance to the Back-end-of-the-Line (BEOL) cleaning in the semiconductor industry;
2. the specific control of chemicals with the nano-clusters may be used in plating/coating processes, particularly in nanotechnogy-related applications;
3. adjustments to the composition may provide a "drier" chemistry to further control the chemical consumption;

4. in some processes a gas/vapor spray may be used to remove particles less than about 50 nanometers along with the drying and curing of previously deposited films.

An expanded power level (process window) is possible for cleaning the newer, more difficult residues as discussed above. The expanded window includes chemistries and chemistry concentrations. Because the chemical concentrations and application time can be significantly reduced, more aggressive chemistries can be used for more precise process control. Thus, the end user can significantly reduce chemical consumption, utilize new chemistries, and significantly reduce if not eliminate certain final rinse and drying steps for submicron features on the substrate. Such features can be found for example in semiconductor devices (memory, logic, etc.), nanotechnologies, post chemical mechanical planarization (CMP) processes, and biotechnologies.

While various descriptions of the present invention are described above, it should be understood that the various features can be used singly or in any combination thereof. Therefore, this invention is not to be limited to only the specifically preferred embodiments depicted herein.

Further, it should be understood that variations and modifications within the spirit and scope of the invention may occur to those skilled in the art to which the invention pertains. For example, in each of the methods disclosed herein, the wet chemistries may be applied to substrates with techniques that that may include stirring, agitation, circulation, sonication, or other techniques as are known in the art. The methods disclosed herein may be applied to a variety of substrates including silicon and III-V semiconductors such as GaAs. Accordingly, all expedient modifications readily attainable by one versed in the art from the disclosure set forth herein that are within the scope and spirit of the present invention are to be included as further embodiments of the present invention. The scope of the present invention is accordingly defined as set forth in the appended claims.

What is claimed is:

1. A method of cleaning post etch residue from submicron features on a semiconductor substrate comprising contacting a surface of the semiconductor substrate with a composition comprising a superacid, wherein the superacid includes a mixture of $FSO_3H$, $SbF_5$, and $SO_2$; a mixture of HF and $BF_3$; or a mixture of $SbF_5$ and HF.

2. The method of claim 1, wherein the submicron features comprise memory.

3. The method of claim 1, wherein the semiconductor substrate includes a photoresist.

4. The method of claim 1, wherein the surface is contacted with the composition for a period of time ranging from 30 seconds to 30 minutes.

5. The method of claim 1, wherein the surface is contacted with the composition for a period of time ranging from 30 seconds to 2 minutes.

6. The method of claim 1, wherein the surface is contacted with the composition for a period of time ranging from 2 minutes to 30 minutes.

7. The method of claim 1, wherein the surface is contacted with the composition at a temperature between 20° C. and 70° C.

8. The method of claim 1, wherein the surface is contacted with the composition at a temperature between 20° C. and 50° C.

9. The method of claim 1, wherein the surface is contacted with the composition at a temperature between 20° C. and 35° C.

10. The method of claim 1, further comprising rinsing the semiconductor substrate with water after contacting the semiconductor substrate with the composition.

11. The method of claim 10, further comprising rinsing the semiconductor substrate with a solvent prior to rinsing the semiconductor substrate with water.

12. The method of claim 1, wherein the superacid is discharged toward the semiconductor substrate through at least one nozzle oriented at an angle between about 0° and about 45° with respect to the surface.

13. The method of claim 1, wherein the superacid is discharged toward the semiconductor substrate through at least one nozzle oriented at an angle between about 0° and about 25° with respect to the surface.

14. The method of claim 1, wherein the superacid is discharged toward the semiconductor substrate through at least one nozzle oriented at an angle no more than about 5° transverse to the surface.

15. The method of claim 1, wherein the superacid in the composition is diluted in the range of 2-10% by weight.

16. A process for removing post etch residue from submicron features on an integrated circuit, which comprises contacting the integrated circuit with a composition comprising a superacid at a temperature and for a time sufficient to remove the residue from the integrated circuit, wherein the superacid includes a mixture of $FSO_3H$, $SbF_5$, and $SO_2$; a mixture of HF and $BF_3$; or a mixture of $SbF_5$ and HF.

17. A method of removing post etch residue from submicron features on a semiconductor wafer comprising contacting the semiconductor wafer with a composition comprising a superacid at a temperature and for a time sufficient to dislodge residue therefrom, wherein the superacid includes a mixture of $FSO_3H$, $SbF_5$, and $SO_2$; a mixture of HF and $BF_3$; or a mixture of $SbF_5$ and HF.

18. A method of removing post etch residue from submicron features on a semiconductor wafer comprising contacting the semiconductor wafer with a composition comprising a superacid at a temperature and for a time sufficient to strip photoresist therefrom, wherein the superacid includes a mixture of $FSO_3H$, $SbF_5$, and $SO_2$; a mixture of HF and $BF_3$; or a mixture of $SbF_5$ and HF.

19. An integrated circuit fabrication process comprising:
etching a semiconductor layer on a wafer;
applying a superacid to the wafer to remove post etch residues from submicron features on the wafer; and
rinsing the wafer with water;
wherein the superacid includes a mixture of $FSO_3H$, $SbF_5$, and $SO_2$; a mixture of HF and $BF_3$; or a mixture of $SbF_5$ and HF.

* * * * *